United States Patent

Huang et al.

[11] Patent Number: 6,121,073
[45] Date of Patent: *Sep. 19, 2000

[54] METHOD FOR MAKING A FUSE STRUCTURE FOR IMPROVED REPAIRED YIELDS ON SEMICONDUCTOR MEMORY DEVICES

[75] Inventors: Kuo Ching Huang, Kaohsiung; Tse-Liang Ying, Hsin-Chu; Cheng Yeh Shih; Yu Hua Lee, both of Hsinchu; Cheng-Ming Wu, Kaoshiung, all of Taiwan

[73] Assignee: Taiwan Semiconductor Manufacturing Company, Hsin-Chu, Taiwan

[*] Notice: This patent is subject to a terminal disclaimer.

[21] Appl. No.: 09/024,479

[22] Filed: Feb. 17, 1998

[51] Int. Cl.$^7$ ............................. H01L 21/82; H01L 27/10
[52] U.S. Cl. ..................... 438/132; 438/601; 438/648; 438/662; 438/685
[58] Field of Search ................................ 438/131, 132, 438/215, 281, 333, 467, 600, 601, 614, 618, 620, 109, 211, 209, 529; 251/700

[56] References Cited

U.S. PATENT DOCUMENTS

| | | | |
|---|---|---|---|
| 5,232,874 | 8/1993 | Rhodes et al. | 438/620 |
| 5,258,096 | 11/1993 | Sandhu et al. | 438/621 |
| 5,457,059 | 10/1995 | Keller et al. | 438/601 |
| 5,721,543 | 2/1998 | Imai et al. | 257/700 |
| 5,821,160 | 10/1998 | Rodriguez et al. | 438/601 |
| 5,891,762 | 4/1999 | Sakai et al. | 438/132 |
| 5,965,927 | 10/1999 | Lee et al. | 257/529 |
| 5,970,346 | 10/1999 | Liaw | 438/281 |

*Primary Examiner*—Olik Chaudhuri
*Assistant Examiner*—William David Coleman
*Attorney, Agent, or Firm*—George O. Saile; Stephen B. Ackerman

[57] ABSTRACT

This invention relates to a novel fuse structure and method for deleting redundant circuit elements on integrated circuits. This fuse structure is useful for increasing the repair yield on RAM chips by deleting defective rows of memory cells. The method involves forming a fuse area in a patterned electrically conducting layer also used to form interconnections. A relatively thin (0.4 um) insulating layer is deposited having a uniform thickness across the substrate. The next level of patterned interconnections is formed with a portion of the layer aligned over the fuse area to serve as an etch-stop layer. For example, the conducting layers can be the first and second polysilicon layers on a RAM chip. The remaining multilevel of interconnections is then formed having a number of relatively thick interlevel dielectric (ILD) layers interposed which can have an accumulative large variation in thickness across the substrate. Fuse windows (openings) are then selectively etched in the ILD layers to the etch-stop layer and the etch-stop layer is selectively etched in the fuse window to the insulating layer over the fuse area. This process allows fuse structures to be built without overetching that can cause fuse damage. The uniform thick insulating layer allows repeatable and reliable laser abrading (evaporation) to open the desired fuses.

23 Claims, 4 Drawing Sheets

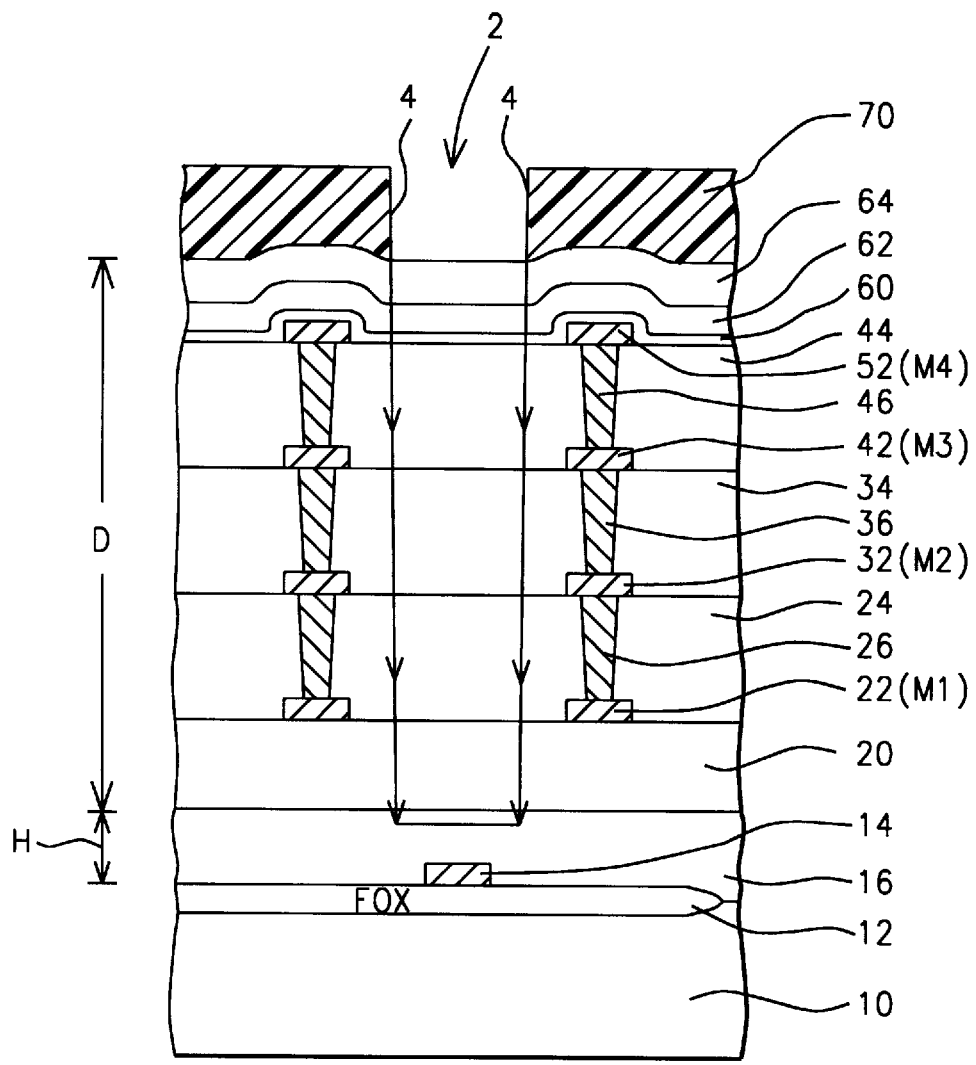
FIG. 1 - Prior Art
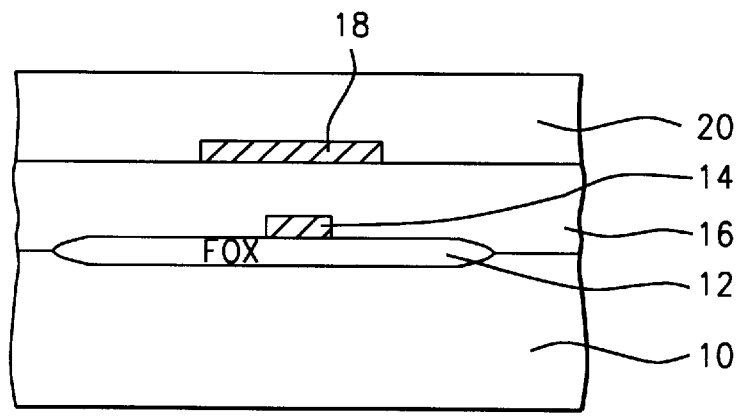
FIG. 2

METHOD FOR MAKING A FUSE STRUCTURE FOR IMPROVED REPAIRED YIELDS ON SEMICONDUCTOR MEMORY DEVICES

BACKGROUND OF THE INVENTION (1) Field of the Invention

The present invention relates to the fabrication of integrated circuits, and more particularly to a method for making improved fuse structures on semiconductor integrated circuits such as on Random Access Memory (RAM) devices. This method and structure utilize an etch-stop layer to accurately remove the non-uniformly thick multilayer insulation over the fuse areas across the substrate. This allows for reliable and repeatable repair yields when fuses are opened to disable defective circuits and to replace them with redundant circuits, such as for enabling additional rows of memory cells on a RAM device.

(2) Description of the Prior Art

Advances in semiconductor processing technologies, such as high-resolution photolithography and anisotropic plasma etching, are dramatically reducing the feature sizes of semiconductor devices and increasing the device packing density. Unfortunately, as the density of the semiconductor devices increases and the number of discrete devices increases on the chip, the final product yield for many integrated circuit devices (chip yield) can decrease. For example, one circuit device that can experience this increase in yield loss with increased circuit elements is dynamic random access memory (DRAM) currently having 64 megabits of memory on a chip. After the year 2000 the number of memory cells is expected to increase further to about 1 to 4 gigabits, and high final product yield will be difficult to achieve without utilizing cell redundancy and repair yield methods.

One method of overcoming this lower yield on RAM devices is to provide additional rows of memory cells and fusing each row of cells. Currently lasers are used to routinely open connections (fuses) in the multimegabit RAMs, such as in DRAM or SRAM devices, to disable defective rows of memory cells and to modify the address decoder so that spare rows of memory cells are selected instead.

To better appreciate the problem associated with making and selectively opening the more conventional fuse, a schematic cross-sectional view of a fuse structure is depicted on substrate 10 in FIG. 1. Typically the fuse 14 is formed as part of a first polysilicon layer 14 at the same time the conductively doped polysilicon layer is patterned to form part of the semiconductor devices, such as the FET gate electrodes on device areas and the local interconnections on the field oxide regions 12. Only the fuse 14 is shown in FIG. 1 to simplify the drawing and discussion. The patterned first polysilicon layer 14 with the fuse area (also labeled 14) is then insulated with a first interpolysilicon oxide (IPO) layer 16, for example using a silicon oxide ($SiO_2$) deposited by chemical vapor deposition (CVD). A conductively doped second polysilicon layer (not shown) is then patterned to form the next level of interconnections (such as bit lines for SRAM and DRAM devices), and a second IPO layer 20 is deposited, such as a CVD $SiO_2$, as an insulating layer. Each of the IPO layers (layers 16 and 20) has contact openings (not shown) to provide interlevel electrical connections between conducting layers. When the semiconductor devices are completed, including the local polysilicon interconnections with fuses, the circuit integration is completed by forming a multilevel of metal interconnections. Four levels of metal are depicted in FIG. 1, but the number of metal layers varies between about 3 and 6, and is expected to increase further on future product. Each layer of patterned metal interconnections is formed by depositing metal layers, such as an aluminium/copper alloy, and patterned by plasma etching. Each patterned metal layer is insulated with an interlevel dielectric (ILD) layer in which via holes are etched and filled with metal (plugs). For example, as shown in FIG. 1, a first metal layer 22 is deposited and patterned to form the patterned first metal layer 22(M1). An ILD layer 24 is deposited and planarized in which via holes are etched and filled with metal plugs 26. In like fashion and repeating the process, a patterned second metal layer 32(M2) with ILD layer 34 and metal plugs 36 are formed, and a third patterned metal layer 42(M3) with an ILD layer 44 and via holes with metal plugs 46 are formed. After completing the metal interconnections with a patterned fourth metal layer 52(M4), the multilevel metallurgy is passivated using a silicon nitride 60, a spin-on glass 62, and a thicker silicon oxynitride layer 64.

To access the fuses 14, a patterned photoresist layer and plasma etching are used to form openings 2 (fuse windows), as depicted by the vertical arrows 4, to a controlled depth D in the passivation layers 64, 62, and 60, and in the thick multilayer of ILD layers 44, 34, 24, and 20 over the fuses 14. This opening 2 must be etched to an accurate depth over the fuse to reliably blow (open) the desired fuse, for example, by laser evaporation.

Unfortunately, because of the very thick multilayer of insulating layers, it is difficult to accurately etch the opening 2 to exactly control the thickness H of the remaining insulating layer ($SiO_2$) over the fuse 14. For example, if the thickness of layer 16 is 4000 Angstroms, then variations in the ILD layers and the passivation layers can result in variation of +/−2000 Angstroms in the thickness of the oxide layer 16 in the opening 2 over the fuse 14. Further exacerbating the problem is the non-uniformity in the ILD layers across the substrate. For example, just a +/−5% variation in the overlying ILD insulating layers and passivation layers (about 8 micrometers) can result in a variation of +/−4000 Angstroms. This makes it very difficult to repeatedly and reliably blow open the required fuses across the substrate 10.

One method of forming fuses on high performance BiCMOS integrated circuits for programmable devices is described by Keller et al., U.S. Pat. No. 5,457,059. However, the method uses titanium/tungsten fuses for field programmable logic (FPL) and does not address the need for forming reliable and repeatable fuse structures for redundant circuits, such as SRAM and DRAM devices. Another reference for utilizing etch-stop layers to make via holes of various depths is described by Sandhu et al. in U.S. Pat. No. 5,258,096. A method for making buried and shallow contacts using an etch-stop layer is described by Rhodes et al. in U.S. Pat. No. 5,232,874. However, the method for making reliable fuse structures is not addressed.

There is still a strong need in the semiconductor industry to further improve the method for making reliable and repeatable fuse structures for improved repair yields on integrated circuits with redundant circuits, such as on DRAM and SRAM devices and the like.

SUMMARY OF THE INVENTION

It is therefore a principal object of the present invention to provide a method for making an improved fuse structure on semiconductor integrated circuits having multilevels of patterned doped polysilicon and multilayers of metal interconnections having insulating layers therebetween.

Another object of this invention is to provide an etch-stop layer over the fuse portion of the patterned polysilicon layer(s) to accurately etch openings in the multilayers of insulating layers to the etch-stop layer over the fuse areas.

It is another object of this invention to provide fuse structures for Random Access Memory (RAM) devices that improve the repair yield.

Still another objective of this invention is to form these fuse structures without including additional processing steps thereby providing a cost-effective manufacturing process.

The method of this invention begins by providing a semiconductor substrate, typically consisting of a lightly doped single-crystal silicon substrate. Field oxide (FOX) regions are formed on the substrate surface surrounding and electrically isolating devices areas. Semiconductor devices, such as field effect transistors (FETs) used in integrated circuits and random access memory (RAM), are then formed in the device areas. The method for forming these improved fuse structures for deleting portions of the integrated circuit or any defective rows of memory cells in a dynamic or static RAM is now described. A first polysilicon layer is deposited that is conductively doped, and is then patterned to form portions of the devices and a first level of electrical interconnections. Portions of the first polysilicon layer serve as fuses in the first level of electrical interconnections over the field oxide isolation. An interpolysilicon oxide (IPO) layer is deposited over the patterned first polysilicon layer. Typically the IPO layer has contact openings to the underlying substrate to provide electrical connections. A conductively doped second polysilicon layer is deposited and patterned to form a second level of electrical interconnections. Further, by the method of this invention, portions of the patterned second polysilicon layer are formed over the fuses to provide an etch-stop layer. An interlevel dielectric (ILD) layer is deposited over the patterned second polysilicon layer. The process continues by forming multilevels of metal interconnections having an ILD between each two levels of patterned metal layers. The number of patterned metal layers in the multilevels is n, where n is the number of patterned metal layers required to complete the metal interconnections for the semiconductor integrated circuits. Typically the current semiconductor technologies use between about three and six metal layers. After completing the metallurgy, a barrier layer such as silicon nitride ($Si_3N_4$) is deposited on the substrate. Then a spin-on glass layer is deposited and annealed on the barrier layer to form a more level surface. The circuits on the substrate are then passivated using a $Si_3N_4$ or a silicon oxynitride (SiON) layer. By the method of this invention, openings are selectively etched through the thick multilevels of insulating layers consisting of the passivation layer, the spin-on glass layer, the barrier layer, and the interlevel dielectric layers to the polysilicon etch-stop layer over the fuses. The polysilicon etch-stop layer is removed selectively to the surface of the IPO layer optically exposing an underlying fuse. For example, the fuse can now be exposed to a laser radiation through the IPO layer to abrade open the fuse for redundant circuits, such as rows of DRAM memory cells which are defective. The method of this invention provides a means for accurately etching to the surface of the IPO layer, which is very uniform, over the fuses across the substrate, which is not achieved by the conventional method of etching the openings over the fuses. This provides a means of reliably opening the desired fuses across the substrate to improve the final product yield (repaired yield). Although the method is specifically shown for an integrated circuit having two polysilicon layers, the method is equally applicable for making these fuse structures in circuits having more than two polysilicon layers. Further, the method and fuse structure with the etch-stop layer can be applied between polycide (polysilicon/silicide) and between metal layers.

BRIEF DESCRIPTION OF THE DRAWINGS

The objects and other advantages of the invention are best understood with reference to the preferred embodiment when read in conjunction with the following drawings.

FIG. 1 is a schematic cross-sectional view of a prior art showing a portion of a semiconductor substrate having four levels of metal interconnections over a field oxide on which is formed a fuse from a polysilicon layer. Also shown is the variation in the depth of the opening over the fuse.

FIGS. 2 through 5 show schematic cross-sectional views for the sequence of process steps for forming an improved fuse structure using a polysilicon etch-stop layer, by the method of this invention, for integrated circuits having a multilevel of interconnections.

DESCRIPTION OF THE PREFERRED EMBODIMENT

Figure 3:
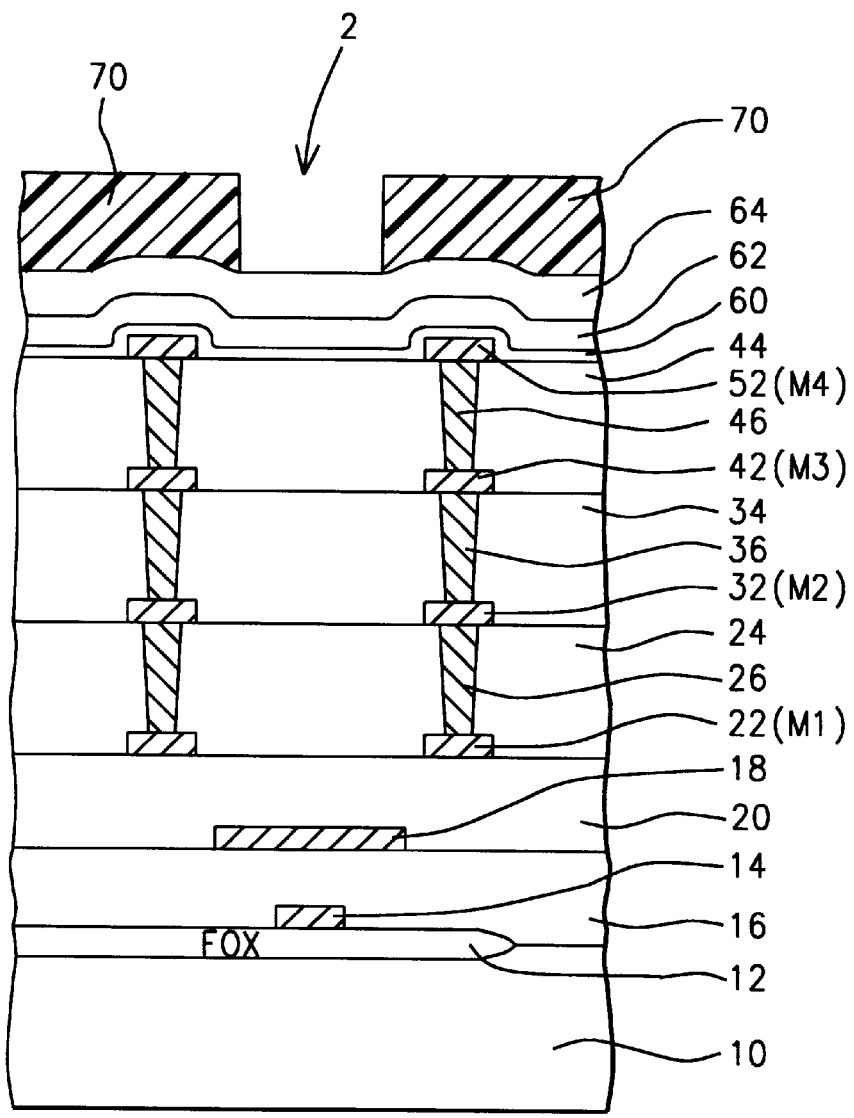

The present invention relates to a method for forming improved fuse structures for integrated circuits having multilevels of patterned conducting layers for interconnecting devices. The method uses an etch-stop layer over the fuse to provide a more reliable repaired yield process for increasing the final product yield. The method utilizes existing process steps to provide a cost-effective manufacturing process. The fuse structure, and method of fabrication, is particularly useful for improving the repair yield on random access memory (RAM) devices. However, it should be well understood by those skilled in the art that the method and structure are generally applicable to semiconductor devices in which portions of an upper patterned electrically conducting layer are used as an etch-stop layer over the fuse area of a patterned lower conducting layer. This etch-stop layer allows one to open fuse windows (openings) in the thick and nonuniform multilayer of interlevel dielectric (ILD) layers to an accurately controlled depth. This provides an accurately controlled oxide thickness over the fuse area for repeatedly and reliably opening the desired fuses by laser abrasion (evaporation).

Shown in FIG. 2 is a portion of a semiconductor substrate 10 having a partially completed fuse structure. These fuse structures are formed over a Field OXide (FOX) isolation region 12 used to electrically isolate the device areas on the substrate. The most widely used substrate in the semiconductor industry is composed of single-crystal silicon having, for example, a <100>crystallographic orientation. Typically the substrate 10 is doped P⁻ for making integrated circuits such as random access memory (RAM) devices, but the method for making these improved fuse structures is equally applicable on other types of substrates. The FOX 12 surrounding the device areas can be formed by various means. For example, one method is the LOCal Oxidation of Silicon (LOCOS) technique in which a stress-release pad oxide and a silicon nitride ($Si_3N_4$) layer (not shown) are patterned to form an oxidation barrier mask over the device areas. The exposed regions of the silicon substrate 10 are then oxidized, for example by steam (wet) oxidation, to form the field oxide 12, as shown in FIG. 2 after removal of the silicon nitride layer. Typically the FOX isolation is grown to a thickness of between about 4000 and 5000 Angstroms. Alternative methods of forming the FOX isolation can be employed, such as shallow trench isolation (STI) commonly used in the industry. However, for the purpose of this invention, the LOCOS method is used to form the FOX isolation 12.

Referring still to FIG. 2, a first polysilicon layer 14 is deposited. For RAM devices, layer 14 is deposited preferably by low-pressure chemical vapor deposition (LPCVD) using silane ($SiH_4$) as the reactant gas, and is doped $N^+$ using arsenic (As) or phosphorus (P). For example, layer 14 can be doped by ion implantation using $p^{31}$, or alternatively can be doped in situ using phosphine ($PH_3$) during deposition to a final concentration of between about 1.0 E 16 and 1.0 E 22 atoms/$cm^3$. Layer 14 is deposited to a thickness of between about 500 and 3000 Angstroms, and more particularly to a thickness of 2000 Angstroms. The first polysilicon layer 14 is then patterned using conventional photolithographic techniques and anisotropic plasma etching to form portions of the semiconductor devices, such as gate electrodes for field effect transistors (FETs) for the access transistor on a DRAM or SRAM device. The patterned polysilicon layer 14 also provides the first level of electrical interconnections. Also important to this invention, portions of layer 14 in the first level of electrical interconnections serve as fuses (also labeled 14) over the FOX isolation 12, as shown in FIG. 2.

Continuing with FIG. 2, an interpolysilicon oxide (IPO) layer 16 is deposited over the patterned first polysilicon layer 14. Preferably the IPO layer 16 is composed of a silicon oxide ($SiO_2$), and is deposited by LPCVD using tetraethosiloxane/ozone (TEOS/$O_3$) as the reactant gas. Layer 16 is deposited to a preferred thickness of between about 1000 and 10000 Angstroms, and more specifically to a thickness of 6000 Angstroms. Contact openings are typically formed in the IPO layer 16 to the substrate 10 to provide electrical contacts for the next level of electrical interconnections, but are not shown in FIG. 2 to simplify the drawing and the discussion.

After depositing the IPO layer 16, a conductively doped second polysilicon layer 18 is deposited. Preferably layer 18 is deposited by LPCVD using $SiH_4$ as the reactant gas, and is doped $N^+$ using As or P similar to layer 14, and is doped to a final concentration of between about 1.0 E 16 and 1.0 E 22 atoms/$cm^3$. Layer 18 is deposited to a preferred thickness of between about 500 and 3000 Angstroms. The second polysilicon layer 18 is then patterned using a photoresist mask and anisotropic plasma etching to form a second level of electrical interconnections. By the method of this invention, layer 18 is also patterned to form an etch-stop layer over the fuses. This etch-stop layer is also labeled 18 and is patterned over the fuse 14, as shown in FIG. 2.

Next, an interlevel dielectric (ILD) layer 20 is deposited over the patterned second polysilicon layer 18. Layer 20 is composed of an insulating material, preferably $SiO_2$, and is deposited by LPCVD using TEOS/$O_3$ to a thickness of between about 5000 and 20000 Angstroms, and more specifically to a thickness of 8000 Angstroms. After depositing layer 20, contact openings are etched to the underlying structure to form electrical interconnections, but are not shown to simplify the drawing and the discussion. Typically the contact openings are filled with a refractory metal, such as tungsten (W), or with a barrier layer such as titanium nitride/titanium (TiN/Ti) and aluminum/copper (Al/Cu) alloy that forms the first metal interconnections.

Referring to FIG. 3 and continuing with the process, a multilevel of metal interconnections is formed to complete the wiring for the integrated circuits. These interconnections can be formed by various methods, such as by a double Damascene process in which trenches and via holes are etched in the ILD and filled with a metal. The metal is then chemical/mechanically polished (CMP) back to form the patterned metal with metal plugs that are planar with the ILD insulating layer. Another, more conventional, method is to deposit a first metal layer 22 on layer 20. Preferably the first metal layer 22 is composed of aluminum/copper (Al/Cu) alloy and is deposited by physical vapor deposition (PVD), such as by sputter deposition. Alternatively, layer 22 can be deposited using a metal organic CVD (MOCVD). The first metal layer 22 is deposited to a preferred thickness of between about 4000 and 10000 Angstroms. Layer 22 is then patterned using an anisotropic plasma etching to form the first level of metal interconnections 22(M1). Next an inter-level dielectric (ILD) 24, also referred to as an intermetal dielectric (IMD) layer, is deposited and planarized over the patterned first metal layer 22. The preferred deposition of layer 24 is to deposit a $SiO_2$ at low temperature using, for example, plasma-enhanced chemical vapor deposition (PECVD) and a reactant gas such as TEOS. Layer 24 is deposited to a thickness of between about 10000 and 20000 Angstroms, and more specifically to a thickness of 15000 Angstroms. Via holes are then etched in the ILD 24 to the first metal layer 22(M1), which are then filled with metal to form metal plugs 26. For example, the metal plugs 26 can be formed by a variety of methods. One method is to deposit a metal and chemical/mechanically polishing back. Alternatively the metal plugs can be formed by filling the via holes when the next metal layer is deposited and patterned.

The number of patterned metal layers in the multilevel metal structure is the number required to complete the wiring for the semiconductor integrated circuits. The number of metal layers can vary. For example, the above process for forming the first level of metal interconnections can be carried out n times to form n levels of metal interconnections. By way of example only, four levels of metal interconnections (wiring) are depicted in FIG. 3. The second level of metal interconnections is formed from patterned layer 32 to form the metal lines 32(M2), having the ILD layer 34 with metal plugs 36. The third level of metal interconnections is formed from patterned layer 42 to form the metal lines 42(M3), having the ILD layer 44 with metal plugs 46. The fourth level of metal interconnections is formed from patterned layer 52 to form the metal lines 52(M4).

Still referring to FIG. 3, after completing the metal interconnections, the substrate is passivated. A relatively thin barrier layer 60 is deposited. Layer 60 is preferably composed of silicon nitride ($Si_3N_4$), deposited by low-temperature processing, such as by PECVD using a reactant gas such as $SiH_4$ and ammonia ($NH_3$) and at a temperature of between about 300 and 400° C. Layer 60 is deposited to a preferred thickness of between about 1000 and 2000 Angstroms. Next, a spin-on-glass layer 62 is deposited on the barrier layer 60 by spin coating, and is cured at a temperature of between about 300 and 500° C. for a time of at least 30 minutes. The thickness of layer 62 is preferably between about 2000 and 4000 Angstroms, and more specifically to 3000 Angstroms of thickness. The passivation is then completed by depositing a $Si_3N_4$ or silicon oxynitride (SiON) layer 64. If a SiON layer is used, layer 64 is deposited to a preferred thickness of between about 8000 and 15000 Angstroms, and more specifically to a thickness of 10000 Angstroms. For example, the SiON can be deposited using a reactant gas mixture of $SiH_4$ with nitrous oxide ($N_2O$) and $NH_3$.

Continuing with FIG. 3, a photoresist layer 70 is spin coated on the substrate and patterned using conventional photolithographic techniques to form openings 4 over the etch-stop layer 18.

Figure 4:
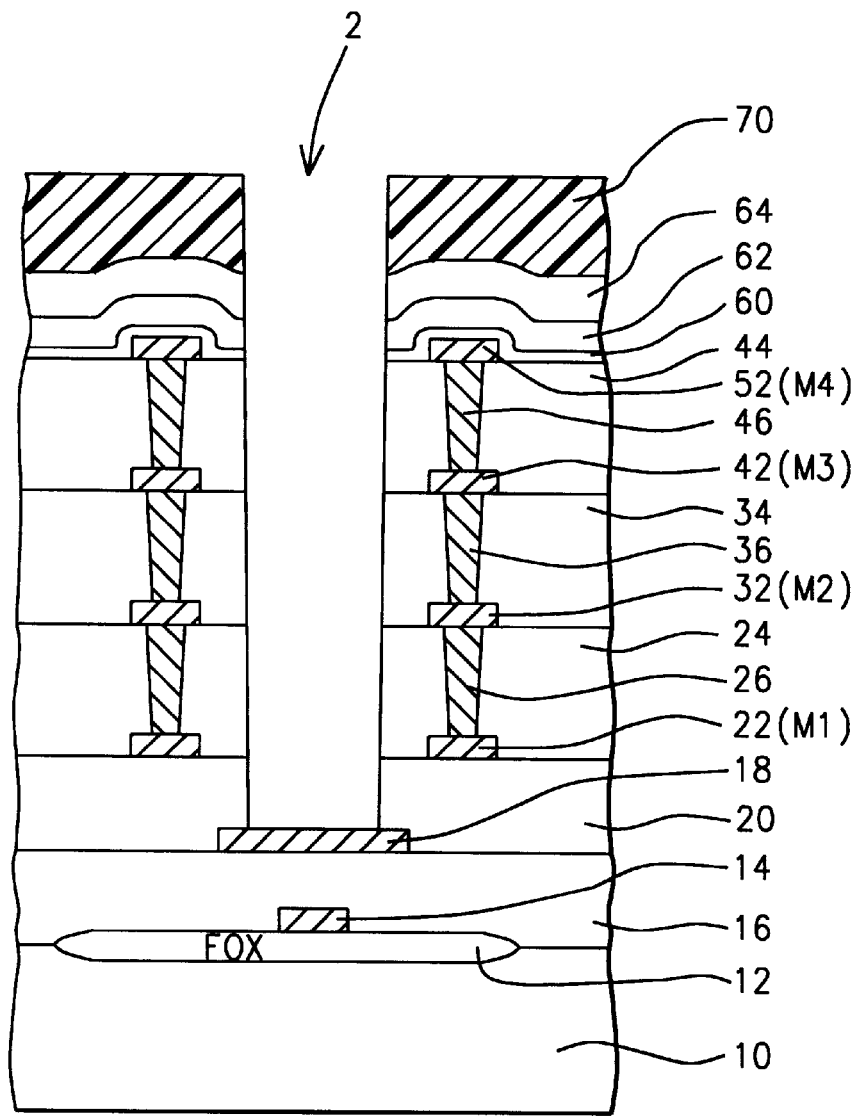

Referring to FIG. 4, by the method of this invention, openings 2 are selectively etched through the passivation layers 64, 62, and 60, and through the thick multilevel of ILDs 44, 34, and 24 to the polysilicon etch-stop layer 18 over the fuse areas 14. The passivation and ILD insulating layers are etched preferably using high-density plasma etching having a high etch-rate selectivity of oxide to polysilicon. For example, the etching can be carried out in an etchant gas such as trifluoromethane ($CHF_3$) and using a carrier gas such as argon (Ar) or helium (He). Alternatively, the etching can be carried out using a reactant gas mixture such as carbon tetrafluoride ($CF_4$) and hydrogen (H) and using a carrier gas such as Ar or He. Preferably the etch-rate selectivity of the PETEOS oxide (ILDs) to polysilicon is greater than about 15:1. This polysilicon etch-stop layer 18 prevents overetching into the IPO layer 16 that can otherwise result in damage to the fuse polysilicon layer 14. Also the prevention of overetching IPO layer 16 results in accurately controlling the thickness of the remaining oxide over the fuse layer areas 14 across the substrate and provides a more reliable and repeatable process for opening the fuses by laser evaporation. By way of example only, if layer 16 is deposited to a thickness of 4000 Angstroms, and the deposition uniformity across the substrate is +/–5%, then the variation in thickness of layer 16 is only +/–200 Angstroms. This improved oxide uniformity is a significant advantage over the conventional method depicted in FIG. 1, and provides a more reliable and repeatable repair yield.

Further, the process does not require additional masking and processing steps since the fuse layer 14 and the etch-stop layer 18 are integrated into the structure during processing for making the polysilicon device (e.g., FET gate electrodes) and polysilicon interconnections.

Although the method is described using patterned polysilicon layers, the method can be applied using other types of layers in place of the polysilicon layers, such as polycide (polysilicon/silicide), metal layers, and the like.

Figure 5:
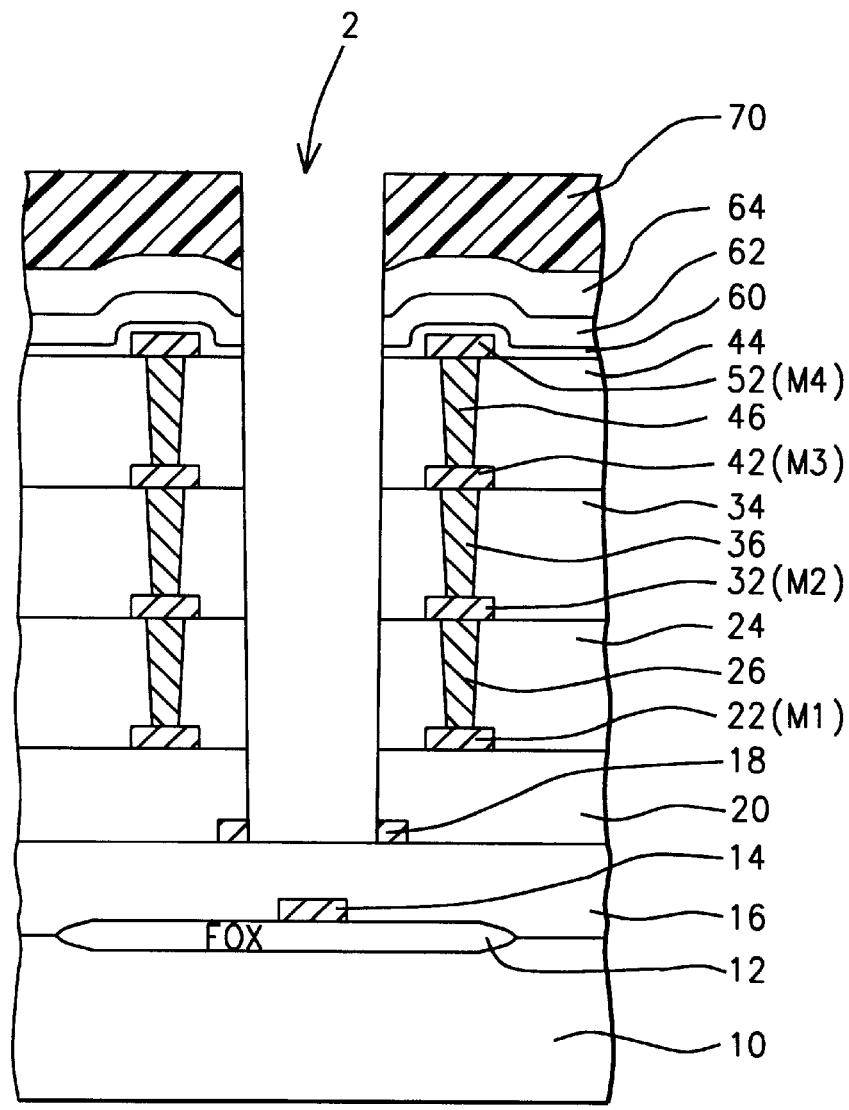

Referring now to FIG. 5, the fuse structure is completed by selectively removing the polysilicon etch-stop layer 18 in the opening 2 down to the IPO layer 16. Preferably the polysilicon layer 18 is removed using a high-density plasma (HDP) etching and an etchant gas mixture containing a chlorine species to provide an etch-rate selectivity of polysilicon to $SiO_2$ that is greater than 20:1. Removing the etch-stop layer provides an optical window to the underlying polysilicon fuse area 14. The fuse can now be exposed to a laser light through the IPO layer 16 to open the fuse for redundant circuits or rows of defective memory cells on RAM devices.

While the invention has been particularly shown and described with reference to the preferred embodiment thereof, it will be understood by those skilled in the art that various changes in form and details may be made without departing from the spirit and scope of the invention. Although the invention is described for a method and structure for integrated circuits having two polysilicon layers, it should also be understood that the invention is equally applicable for making fuses in circuits having more than two polysilicon layers.

What is claimed is:

1. A method for fabricating fuse structures for semiconductor integrated circuits comprising the steps of:
   a) providing a semiconductor substrate having devices in device areas surrounded by a field oxide isolation;
   b) depositing a first polysilicon layer;
   c) patterning said first polysilicon layer to form portions of said devices and a first level of electrical interconnections, and further forming portions for fuses in said first level of electrical interconnections over said field oxide isolation;
   d) depositing an interpolysilicon oxide layer over said patterned first polysilicon layer;
   e) depositing a second polysilicon layer;
   f) patterning said second polysilicon layer to form a second level of electrical interconnections, and further having portions of said second polysilicon layer over said fuses to provide an etch-stop layer;
   g) depositing over said substrate an interlevel dielectric layer having via holes with interconnecting metal plugs;
   h) depositing and patterning over said interdielectric layer a metal layer to form the next level of electrical interconnections;
   i) carrying out steps g) through h) n times to complete said metal interconnections for said semiconductor integrated circuits, where the number of metal levels is n, and where n is at least 1;
   j) depositing a barrier layer on said substrate;
   k) coating a spin-on glass layer on said barrier layer;
   l) depositing a passivation layer on said spin-on glass layer;
   m) etching openings through said passivation layer, said spin-on glass layer, said barrier layer, and through said interlevel dielectric layers to said etch-stop layer over said fuses;
   n) removing completely said etch-stop layer to complete said fuse structures having said interpolysilicon layer that is uniformly thick across said substrate over said fuses.

2. The method of claim 1, wherein said first polysilicon layer is conductively doped and is deposited to a thickness of between about 500 and 3000 Angstroms.

3. The method of claim 1, wherein said interpolysilicon oxide layer is a chemical vapor deposited silicon oxide and is deposited to a thickness of between about 1000 and 10000 Angstroms.

4. The method of claim 1, wherein said second polysilicon layer is conductively doped and is deposited to a thickness of between about 500 and 3000 Angstroms.

5. The method of claim 1, wherein said interlevel dielectric layer over said second polysilicon layer on said substrate is a chemical vapor deposited silicon oxide and is deposited to a thickness of between about 5000 and 20000 Angstroms.

6. The method of claim 1, wherein said metal layer is aluminum/copper alloy and is deposited to a thickness of between about 4000 and 10000 Angstroms.

7. The method of claim 1, wherein said interlevel dielectric layer over said patterned metal layer on said substrate is silicon oxide deposited by plasma enhanced chemical vapor deposition using tetraethosiloxane (TEOS), and is deposited to a thickness of between about 10000 and 20000 Angstroms.

8. The method of claim 1, wherein said interconnecting metal plugs between metal lines are composed of tungsten.

9. The method of claim 1, wherein said barrier layer is silicon nitride deposited by plasma enhanced chemical vapor deposition to a thickness of between about 1000 and 2000 Angstroms.

10. The method of claim 1, wherein said spin-on glass layer is deposited to a thickness of between about 2000 and 4000 Angstroms and is cured at a temperature of between about 300 and 500° C. for about 30 to 50 minutes.

11. The method of claim 1, wherein said passivation layer is a plasma enhanced chemical vapor deposited silicon oxynitride (SiON) having a thickness of between about 8000 and 15000 Angstroms.

12. A method for fabricating fuse structures for random access memory (RAM) devices having redundant rows of memory cells comprising the steps of:

a) providing a semiconductor substrate having an array of said memory cells formed in part from a patterned first polysilicon layer and further said patterned first polysilicon layer forming a first level of electrical interconnections having polysilicon fuses in said rows of said memory cells for removal of defective rows of said memory cells and for modifying address circuits when replacing said defective rows with said redundant rows of said memory cells;
   b) depositing an interpolysilicon oxide layer over said patterned first polysilicon layer;
   c) depositing a second polysilicon layer;
   d) patterning said second polysilicon layer to form a second level of electrical interconnections, and further having portions of said second polysilicon layer over said fuses to provide an etch-stop layer;
   e) depositing over said substrate an interlevel dielectric layer having via holes with interconnecting tungsten metal plugs;
   f) depositing and patterning over said interlevel dielectric layer a metal layer to form the next level of electrical interconnections;
   g) carrying out steps e) through f) n times to complete said metal interconnections for said random access memory devices, where the number of metal levels is n, and where n is at least 1;
   h) depositing a barrier layer on said substrate;
   i) coating a spin-on glass layer on said barrier layer;
   j) depositing a passivation layer on said spin-on glass layer;
   k) etching openings through said passivation layer, said spin-on glass layer, said barrier layer, and through said interlevel dielectric layers to said etch-stop layer over said fuses;
   l) removing completely said etch-stop layer to complete said fuse structures having said interpolysilicon layer that is uniformly thick across said substrate over said fuses.

13. The method of claim 12, wherein said first polysilicon layer is conductively doped and is deposited to a thickness of between about 500 and 3000 Angstroms.

14. The method of claim 12, wherein said interpolysilicon oxide layer is a chemical vapor deposited silicon oxide and is deposited to a thickness of between about 1000 and 10000 Angstroms.

15. The method of claim 12, wherein said second polysilicon layer is conductively doped and is deposited to a thickness of between about 500 and 3000 Angstroms.

16. The method of claim 12, wherein said interdielectric layer over said second polysilicon layer on said substrate is a chemical vapor deposited silicon oxide and is deposited to a thickness of between about 5000 and 20000 Angstroms.

17. The method of claim 12, wherein said metal layer is aluminum/copper alloy and is deposited to a thickness of between about 4000 and 10000 Angstroms.

18. The method of claim 12, wherein said interdielectric layer over said patterned metal layer on said substrate is silicon oxide deposited by plasma enhanced chemical vapor deposition using tetraethosiloxane (TEOS), and is deposited to a thickness of between about 10000 and 20000 Angstroms.

19. The method of claim 12, wherein said barrier layer is silicon nitride deposited by plasma enhanced chemical vapor deposition to a thickness of between about 1000 and 2000 Angstroms.

20. The method of claim 12, wherein said spin-on glass layer is deposited to a thickness of between about 2000 and 4000 Angstroms and is cured at a temperature of between about 300 and 500° C. for about 30 to 50 minutes.

21. The method of claim 12, wherein said passivation layer is a plasma enhanced chemical vapor deposited silicon oxynitride (SiON) having a thickness of between about 8000 and 15000 Angstroms.

22. The method of claim 12, wherein said random access memory device is a dynamic random access memory (DRAM) device.

23. The method of claim 12, wherein said random access memory device is a static random access memory (SRAM) device.

* * * * *